United States Patent
Newton

(10) Patent No.: US 10,100,409 B2
(45) Date of Patent: Oct. 16, 2018

(54) ISOTHERMAL WARM WALL CVD REACTOR

(71) Applicant: United Technologies Corporation, Hartford, CT (US)

(72) Inventor: Kirk C. Newton, Enfield, CT (US)

(73) Assignee: United Technologies Corporation, Farmington, CT (US)

( * ) Notice: Subject to any disclaimer, the term of this patent is extended or adjusted under 35 U.S.C. 154(b) by 323 days.

(21) Appl. No.: 14/619,338

(22) Filed: Feb. 11, 2015

(65) Prior Publication Data
US 2016/0230279 A1    Aug. 11, 2016

(51) Int. Cl.
*C23C 16/44* (2006.01)
*C23C 16/46* (2006.01)
(Continued)

(52) U.S. Cl.
CPC ............ *C23C 16/46* (2013.01); *C23C 16/045* (2013.01); *C23C 16/06* (2013.01); *C23C 16/26* (2013.01); *C23C 16/32* (2013.01); *C23C 16/325* (2013.01); *C23C 16/342* (2013.01); *C23C 16/345* (2013.01); *C23C 16/403* (2013.01); *C23C 16/4401* (2013.01); *C23C 16/4412* (2013.01)

(58) Field of Classification Search
CPC .... C23C 16/46; C23C 16/4401; C23C 16/045
See application file for complete search history.

(56) References Cited

U.S. PATENT DOCUMENTS 4,258,658 A * 3/1981 Politycki ........... C23C 16/45565
                                                                118/719
4,545,327 A   10/1985 Campbell et al.
(Continued)

FOREIGN PATENT DOCUMENTS

JP         H02259075 A    10/1990

OTHER PUBLICATIONS

Extended European Search Report, for European Patent No. 16155179.1, dated May 6, 2016, 8 pages.

*Primary Examiner* — Gordon Baldwin
*Assistant Examiner* — Mirza Israr Javed
(74) *Attorney, Agent, or Firm* — Kinney & Lange, P.A.

(57) ABSTRACT

A chemical vapor deposition (CVD) reactor includes a double wall vacuum processing chamber with an inner wall and an outer wall and fluid passages between the walls. A layer of thermal insulation covers the outer wall. A layer of high temperature thermal insulation covers the inner wall. Heating elements are positioned in the interior of the processing chamber to heat a substrate mounted in the chamber. A gas inlet structure is positioned through the inner and outer walls of the chamber and oriented to direct a flow of reactant gas against the substrate to form a CVD coating on the substrate. A gas outlet structure connected to a vacuum and effluent management system is positioned through the inner and outer walls of the chamber. Fluid inlet and outlet structures positioned to circulate heated thermal transfer fluid through the passages between the inner and outer walls maintain a controlled isothermal inner wall temperature above a condensation temperature of reactant gas and effluent reacted gas byproducts from condensing on the inner walls and insulation in the chamber.

18 Claims, 2 Drawing Sheets

(51) Int. Cl.
  *C23C 16/04* (2006.01)
  *C23C 16/34* (2006.01)
  *C23C 16/26* (2006.01)
  *C23C 16/32* (2006.01)
  *C23C 16/40* (2006.01)
  *C23C 16/06* (2006.01)

(56) References Cited

U.S. PATENT DOCUMENTS

| | | | |
|---|---|---|---|
| 4,793,283 A * | 12/1988 | Sarkozy | C23C 16/4412 |
| | | | 118/715 |
| 5,374,412 A * | 12/1994 | Pickering | C04B 35/571 |
| | | | 423/346 |
| 5,792,257 A | 8/1998 | Kordia et al. | |
| 6,010,744 A | 1/2000 | Buskirk et al. | |
| 6,143,128 A | 11/2000 | Ameen et al. | |
| 2006/0022387 A1* | 2/2006 | Ueno | F27B 14/08 |
| | | | 266/104 |
| 2007/0117484 A1* | 5/2007 | Kmetz | C23C 16/342 |
| | | | 442/127 |
| 2013/0330930 A1* | 12/2013 | Saido | C23C 16/4557 |
| | | | 438/758 |
| 2014/0094617 A1* | 4/2014 | Dubois | B01J 19/249 |
| | | | 549/248 |

* cited by examiner

ISOTHERMAL WARM WALL CVD REACTOR

BACKGROUND

This invention relates to chemical vapor deposition. In particular the invention relates to improved throughput and process cleanliness.

Chemical vapor deposition (CVD) or chemical vapor infiltration (CVI) reactions are processes in which gas phase precursors are reacted together to form a solid phase coating material with resulting gas phase byproducts from the reaction being carried away and trapped or vented. CVD processes may be used in applications that require certain process attributes, including high purity coatings, non-line of sight processing, ability to infiltrate porous substrates and fill open voids with solid phase materials and extremely thin or very tightly controlled coating thickness layers. In most industrial CVD applications, the energy required to cause the reaction between the reactant gasses is supplied in the form of heat in a resistance or induction heated furnace or reactor. Typical CVD reaction temperatures range from 400° C. up to 1600° C. depending on the desired deposition phase, reaction chemistry and substrate material. In applications that require precise coating thickness control or infiltration of a porous substrate, such as the formation of a ceramic matrix composite via CVI, the process is conducted at reduced pressure to reduce the reaction rate and to extend the mean free path of the reactants.

The partial pressure of byproducts may increase by several orders of magnitude as they cool and pass through a vacuum system. Depending on the process and byproduct chemistry, the byproducts may stay in the gas phase through the entire vacuum system, or they may condense into a solid or liquid material. In processes where the byproducts tend to condense, great effort is usually used to control where the material condenses so that it can be easily cleaned without dismantling and cleaning the entire CVD system. The condensation of reactant byproducts in vacuum pumps can be particularly problematic causing pump failure in some instances. To circumvent this issue, various cold traps and particle traps are used to condense the byproduct ahead of the pump. Various additional systems may be employed such as heated vacuum lines to insure that byproducts stay in the gas phase until they reach a trap. The presence of reaction byproducts in a vacuum system or process chamber interrupt process yield and adds significant maintenance costs. The problem is particularly acute when the byproduct is hydroscopic and attracts moisture from the atmosphere each time the process chamber is opened for a batch change.

SUMMARY

A chemical vapor deposition (CVD) reactor includes a double wall vacuum processing chamber with an inner wall and an outer wall and fluid passages between the walls. A layer of thermal insulation covers the outer wall. A layer of high temperature thermal insulation covers the inner wall. Heating elements are positioned in the interior of the processing chamber to heat a substrate mounted in the chamber. A gas inlet structure is positioned through the inner and outer walls of the chamber and oriented to direct a flow of reactant gas against the substrate to form a CVD coating on the substrate. A gas outlet structure connected to a vacuum and effluent management system is positioned through the inner and outer walls of the chamber. Fluid inlet and outlet structures positioned to circulate heated thermal transfer fluid through the passages between the inner and outer walls maintain a controlled isothermal inner wall temperature above a condensation temperature that prevents reactant gas and reacted gas effluent byproducts from condensing on the inner walls and insulation in the chamber.

A method of coating a substrate in a chemical vapor deposition (CVD) reactor includes mounting the substrate in a CVD reactor that includes a double wall vacuum processing chamber with an inner wall, an outer wall and fluid passages between the walls. The reactor further includes a layer of thermal insulation covering the outer wall, a layer of high temperature thermal insulation covering the inner wall, heating elements mounted in an interior of the processing chamber, and a gas inlet structure positioned through the inner and outer walls of the chamber and oriented to direct a flow of reactant gas at the substrate. The reactor further includes a gas outlet structure positioned through the inner and outer walls of the reactor connected to a vacuum and effluent management system as well as a fluid inlet and outlet structure positioned to circulate fluid through the fluid passages. The method includes flowing temperature controlled thermal fluid through the fluid passages to maintain the inner wall of the reaction chamber above a condensation temperature of the reactant gas and reacted gas effluents, heating the substrate to a reaction temperature, and directing a flow of the reactant gas at the heated substrate to form a ceramic coating on the substrate. Excess reactant gas and reacted gas effluent is eliminated from the chamber with the vacuum and effluent gas management system. Following a run, the chamber is returned to room temperature and the coated substrate is removed.

DETAILED DESCRIPTION

The present disclosure is directed to a CVD or CVI reactor design that minimizes recurring costs and down time related with maintenance operations required to clean condensable reaction byproducts from process equipment. In many applications one or more reaction byproducts may condense in a solid or liquid form upon contact with a relatively cool surface. In many traditional CVD processes, hydroscopic solid condensable byproducts may build up in the insulation and interior walls of a cold wall CVD reactor. The byproducts tend to absorb moisture during batch changes and may create a significant contamination problem for subsequent batches. Deposition of condensable byproducts in the process chamber may also accelerate degradation of the thermal conductivity of the insulation used in the reactor, leading to thermal profile changes over time and process yield losses due to process condition shifts. The isothermal warm wall CVD reactor design of the present invention provides a methodology and design to maintain the CVD chamber at an isothermal condition at a high enough temperature to significantly reduce or eliminate condensation of condensable reaction byproducts in the CVD chamber. A dual wall jacketed chamber design similar to a traditional water cooled furnace chamber is employed, but the jacket space is filled with a thermal transfer fluid instead of process cooling water. The thermal transfer fluid is maintained at a constant temperature that is high enough to prevent the condensation of condensable phases inside the process chamber. By maintaining the vacuum chamber at an isothermal elevated temperature, the dimensional integrity of the vacuum chamber, which is critical for vacuum tight seals, is maintained. Under all normal operating conditions, the entire chamber may be maintained at a required elevated temperature minimizing thermal expansion gradients in the chamber thereby minimizing warping or leaks.

Figure 1:
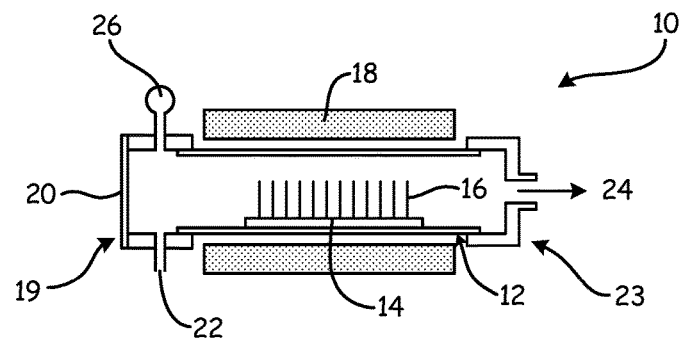
FIG. 1 is a schematic representation of a hot wall CVD reactor.

A schematic representation of prior art hot wall CVD reactor 10 is shown in FIG. 1. Reactor 10 comprises quartz tube 12 containing substrate support 14 and substrates 16. In an embodiment, substrates 16 may require abrasion resistant high temperature coatings of, for instance, nitrides or carbides. Exemplary nitrides and carbides include, as non-limiting examples, BN, $Si_3N_4$, $B_4C$, $S_iC$, and TiC.

Substrate support 14 and substrates 16 are surrounded by furnace 18. Furnace 18 may be any high temperature furnace known in the art. An exemplary furnace may be a resistance furnace. Quartz tube 12 may be capped at each end with caps 19 and 23 to maintain a controlled atmosphere in quartz tube 12. Cap 19 contains loading door 20, reactive gas inlet 22 and pressure sensor 26. Cap 23 houses gas outlet 24 attached to a vacuum system not shown. In hot wall reactor 10, during a coating run, all surfaces at a reaction temperature will be coated with a coating of choice. This includes the inside of quartz tube 12.

Figure 2:
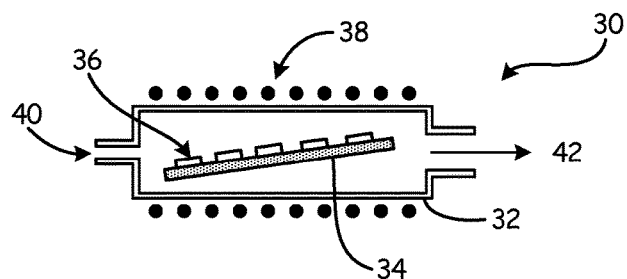
FIG. 2 is a schematic representation of a cold wall CVD reactor.

In the cold wall CVD reactor category, two embodiments are common. In one example, thermal insulation is not necessary. A schematic representation of a prior art cold wall reactor of this type is shown in FIG. 2. Cold wall reactor 30 includes process chamber 32 containing graphite susceptor 34, samples 36 and induction heating coil 38 surrounding process chamber 32. During a run, graphite susceptor 34 is heated by RF induction heating coil 38 and, in turn, heats samples 36 to a reaction temperature. A reactive gas entering gas inlet 40 then deposits a CVD coating on samples 36 before leaving process chamber 32 through vent 42. Process chamber 32 must be transparent to RF induction radiation and quartz or fused silica are common chamber walls in the art. In the embodiment shown in FIG. 2, the process chamber is not insulated and may not appreciably heat up during a run. If process chamber 32 does heat up and is a quartz tube, the tube can be easily removed and cleaned.

Figure 3:
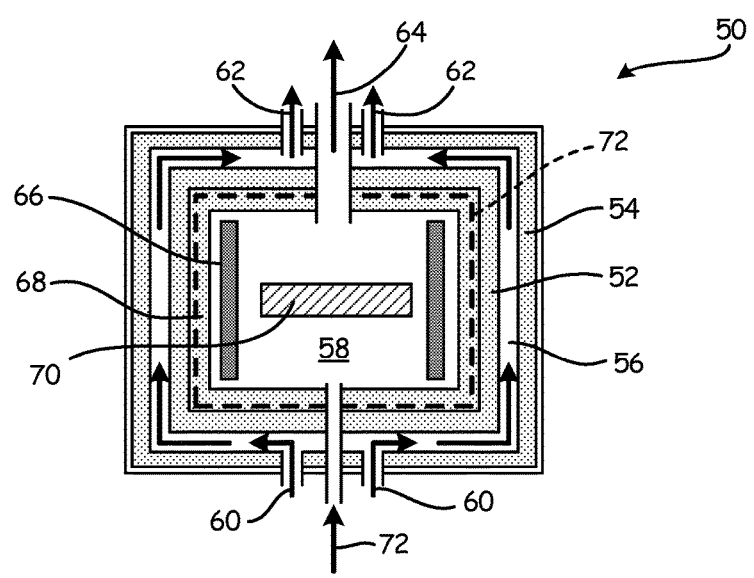
FIG. 3 is a schematic representation of a typical industrial cold wall CVD reactor.

In contrast to the non-insulated induction heated CVD reactor shown in FIG. 2, common large scale CVD applications require reactor configurations that employ a water cooled vacuum chamber with an induction or resistance furnace inside the chamber. A schematic representation of a prior art industrial cold wall CVD reactor is shown in FIG. 3. Cold wall CVD reactor 50 includes a dual wall water cooled metal jacket comprising inner wall 52, outer wall 54 and cooling chamber 56 surrounding vacuum reaction chamber 58. Water cooling, schematically shown by arrows 60 entering and arrows 62 exiting chamber 56 allows the walls of vacuum chamber 58 to be maintained at an isothermal temperature thereby preventing local temperature gradients to form that may cause distortion of the vacuum chamber resulting in leaks as well as providing cooling for o-rings and other seals that may be degraded at higher temperatures.

Vacuum reaction chamber 58 is connected to a vacuum system, traps and other equipment known in the art as schematically indicated by arrow 64. Chamber 58 contains heating elements 66 and interior high temperature insulation 68. During a run, sample 70 and a sample holder (not shown) are heated to a reaction temperature and exposed to a reactive gas entering chamber 58 through a gas inlet schematically illustrated by arrow 72. Reactant gas 72 deposits a coating on all surfaces heated to the reaction temperature of interest and then passes out of reaction chamber 58 as indicated by arrow 64.

Examples of a CVD reaction are the deposition of boron nitride (BN) and silicon nitride ($Si_3N_4$) from an ammonia containing reactive gas. BN can be deposited according to the following reaction.

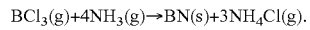

$$BCl_3(g)+4NH_3(g) \rightarrow BN(s)+3NH_4Cl(g).$$

Ammonium chloride ($NH_4Cl$) is a gas at deposition temperatures of 800° C. to 1000° C. The gas can condense as a solid on surfaces at temperatures between 150° C. to 200° C. depending on pressure. Solid $NH_4Cl$ is a hydroscopic salt that, when exposed to the atmosphere, will absorb moisture that seriously impedes future CVD processing in the reactor if the condensed material is not removed. Outgassing from the condensed salt causes oxygen contamination in the product and prohibitively long pump down times to achieve a hard vacuum.

A natural site for condensable CVD byproducts in a water cooled reactor is high temperature furnace insulation 68 close to inner wall 52 of cold wall CVD reactor 50. Deposition of materials condensing from a reactive gas onto porous insulation acts like a cryogenic vacuum pump which tends to draw more byproducts into the insulation. As thermal insulation 68 fills with condensable byproduct schematically indicated by dotted line 72 in FIG. 3, the thermal conductivity of insulation layer 68 increases and the thermal profile and process conditions in reactor 50 degrade. Every time reactor chamber 58 is opened to the atmosphere, hydroscopic deposits 72 absorb moisture and further impede process conditions. The phenomenon of hydroscopic condensable byproduct buildup 72 in cold wall CVD reactors is the primary concern of the present disclosure.

Figure 4:
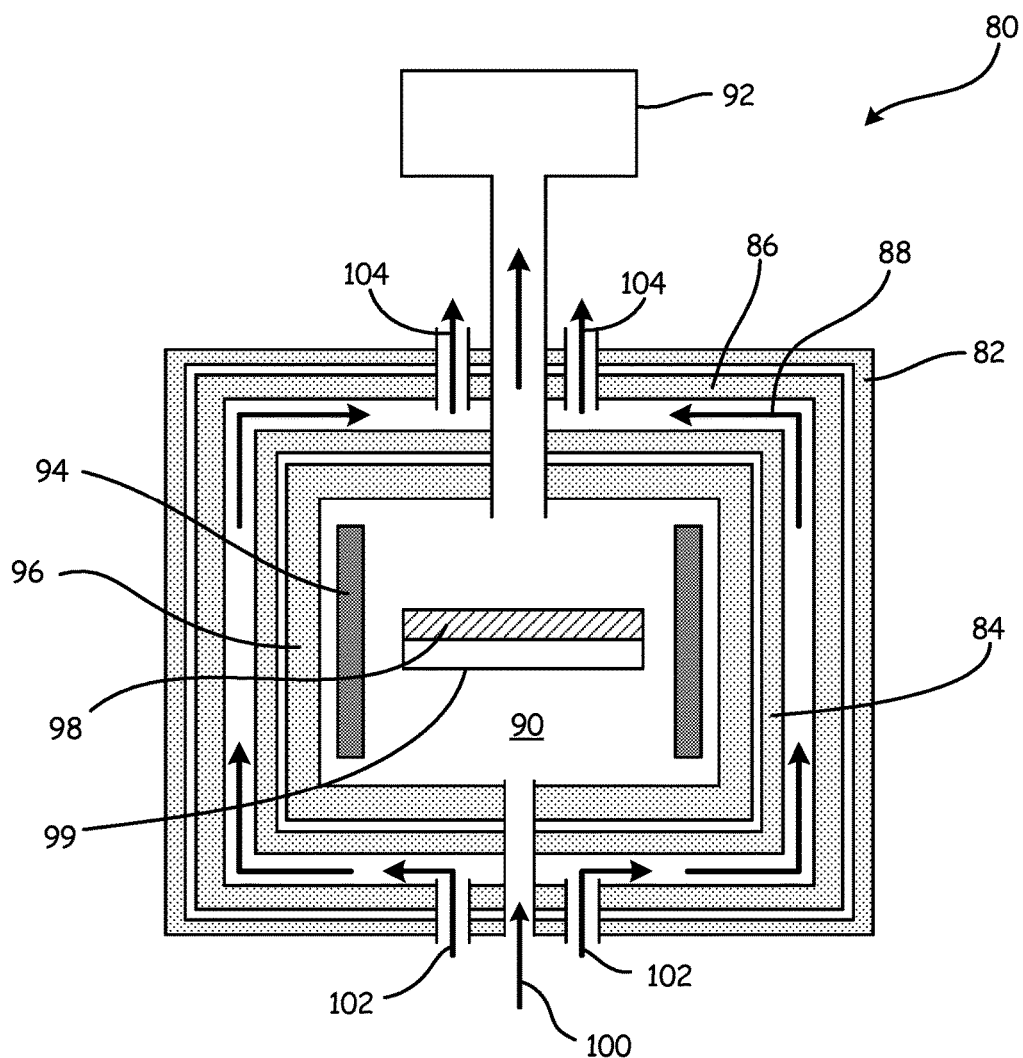
FIG. 4 is a schematic representation of a warm wall CVD reactor of the invention.

A schematic representation of warm wall CVD reactor 80 according to an embodiment of the present invention is shown in FIG. 4. Warm wall CVD reactor 80 includes exterior insulation layer 82, a dual wall metal heat exchanger comprising inner wall 84, outer wall 86 and fluid chamber 88 surrounding vacuum reaction chamber 90. Exemplary exterior insulation may comprise insulation jackets with a hot face of woven fiberglass, Nextel™ alumino-silicate, or similar material, an insulation filling such as fiberglass, and an outer liner such as PTFE, silicone, fiberglass or aluminum. Alternate solutions for the exterior insulation could include metal radiant heat shields, insulation board such as rigidized fiberglass, high temperature foam insulation such as silicone foam and any other material that is rated for the required isothermal chamber wall surface temperature. Vacuum reaction chamber 90 is connected to a vacuum system, traps and other equipment known in the art as schematically indicated by 92. Chamber 90 contains heating elements 94 and interior high temperature fibrous insulation 96. Heating elements 94 may be electrical resistance elements or inductive elements. High temperature insulation is material that can operate at temperatures exceeding 1000° c. Exemplary high temperature insulation may include polyacrylonitrile (PAN), Pitch or Rayon based carbon felt, Pitch or Rayon based graphite felt (carbon felt heat treated to fully graphitize the carbon structure), rigidized PAN, Pitch or Rayon based carbon or graphite board, ceramic oxide boards or ceramic oxide fiber blankets such as silica, alumino-silicate, high alumina and zirconia based insulation materials. Furnace insulation may include one or more solid surfaces or layers within the insulation to further inhibit reactant and byproduct infiltration into the insulation, such as graphoil facings, carbon/carbon composite facings, liquid based surface sealants such as graphite cement or DAG (colloidal graphite coatings) or high temperature or refractory metal foils or sheets.

During a run, sample 98 and sample holder 99 are heated to a reaction temperature and exposed to a reactive gas entering chamber 90 through a gas inlet schematically illustrated by arrow 100. Reactive gas 100 deposits a coating on all surfaces heated to the reaction temperature of interest and then passes out of vacuum reaction chamber 90 into vacuum and effluent gas management system 92. As indicated above, it is a purpose of various embodiments of the present invention to prevent the condensation of reaction products in chamber 90 where they may absorb moisture and other contaminants when chamber 90 is open to the atmosphere between runs. In order to accomplish this, fluid chamber 88 is filled with a heated thermal transfer fluid that enters chamber 88 schematically shown by arrows 102 and exits chamber 88 schematically shown by arrows 104. Exemplary thermal transfer fluids may comprise mineral oil based fluids, synthetic aromatic thermal fluids, and others which are commercially available fluids known in the art. The heated thermal transfer fluid is maintained at a constant temperature of up to 400° C., and in most embodiments, typically at about 150° C. to about 300° C., thereby keeping the walls of chamber 90 above the condensation temperature of condensable reaction products in the reactive gas. This eliminates the formation of condensed reaction byproducts on the walls of chamber 90 and, most importantly, on the fibers of high temperature insulation 96. Product quality is maintained and increased product throughput is achieved.

Discussion of Possible Embodiments

The following are non-exclusive descriptions of possible embodiments of the present invention.

A chemical vapor deposition (CVD) reactor may include: a double wall vacuum processing chamber with an inner wall and an outer wall; a layer of thermal insulation surrounding the outer wall; a layer of high temperature thermal insulation covering the inner wall; heating elements positioned in an interior of the processing chamber; a gas inlet structure positioned through the inner and outer walls of the processing chamber and oriented to direct a flow of reactant gas against a substrate and a support in the processing chamber to form a CVD coating on the substrate; a gas outlet structure positioned through the inner and outer walls of the processing chamber and connected to a vacuum and effluent gas management system; and fluid inlet and outlet structures positioned to circulate heated thermal transfer fluid through a passage between the inner wall and the outer wall of the double wall vacuum processing chamber to maintain a controlled isothermal inner wall temperature above a condensation temperature to prevent effluent byproducts from condensing on the inner walls and the high temperature insulation in the chamber.

The reactor of the preceding paragraph can optionally include, additionally and/or alternatively any, one or more of the following features, configurations and/or additional components:

Each wall of the double wall vacuum chamber may be metal.

The metal may be stainless steel.

The high temperature insulation may be a fibrous insulation.

The fibrous insulation may be carbon felt, graphite felt, rigidized carbon board, rigidized graphite board, oxide ceramic blanket, or rigid oxide board formed of silica, alumino-silicate, hi-alumina or zirconia.

The CVD coating may be C, Si, CBN, $Si_3N_4$, $B_4C$, HfC, $HfB_2$, TiN, $Al_2O_3$, W, or WC.

The CVD coating may be BN.

The reactant gas may be a mixture of $BCl_3$ and $NH_3$.

The thermal transfer fluid may be a mineral oil based thermal transfer fluid or synthetic aromatic thermal transfer fluids.

A method of coating a substrate by chemical vapor deposition (CVD) may include: mounting the substrate in a CVD reactor that may include; a double wall vacuum processing chamber with an inner wall and an outer wall and fluid passages between the inner wall and outer wall; a layer of thermal insulation covering the outer wall; a layer of high temperature thermal insulation covering the inner wall; heating elements positioned in an interior of the processing chamber; a gas inlet structure positioned through the inner and outer wall of the processing chamber and oriented to direct a flow of reactant gas against the substrate; a gas outlet structure positioned through the inner and outer wall of the processing chamber and connected to a vacuum and effluent gas management system; and a fluid inlet and outlet structure positioned in the reactor to circulate fluid through the fluid passages; flowing temperature controlled thermal fluid in the fluid passages to maintain the inner wall of the reaction chamber at a controlled temperature above a condensation temperature of the reacted gas and reacted effluent; heating a substrate to at least one reaction temperature with the heating elements; directing a flow of the reactant gas at the heated substrate to form at least one ceramic coating on the substrate; eliminating excess reactant gas and reacted gas effluent from the chamber with the vacuum and effluent gas management system; returning the chamber to room temperature and pressure; and removing the coated substrate.

The method of the preceding paragraph can optionally include, additionally and/or alternatively any, one or more of the following features, configurations and/or additional components:

The temperature of the inner wall of the double wall processing chamber may be up to about 400° C.

The temperature of the inner wall of the processing chamber may be from about 150° C. to about 300° C.

The ceramic coatings may include C, SiC, BN, $Si_3N_4$, $B_4C$, HfC, $HfB_2$, TiN, $Al_2O_3$, W and WC.

The ceramic coating may be BN.

The reactant gas may be a mixture of $BCl_3$ and $NH_3$.

The heating elements may be resistance heating elements or inductive heating elements.

The high temperature insulation may be fibrous insulation.

The fibrous insulation may be carbon felt, graphite felt, rigidized carbon board, rigidized graphite board, oxide ceramic blanket, or rigid oxide board formed of silica, alumino-silicate, hi-alumina or zirconia rigid ceramic board.

Each wall of the double wall vacuum processing chamber may be metal.

The thermal transfer fluid may be a mineral oil based thermal transfer fluid or synthetic aromatic thermal transfer fluid.

Although the present invention has been described with reference to preferred embodiments, workers skilled in the art will recognize that changes may be made in form and detail without departing from the spirit and scope of the invention.

The invention claimed is:

1. A chemical vapor deposition (CVD) reactor comprising:
   a double wall vacuum processing chamber with a metal inner wall and a metal outer wall;
   a layer of thermal insulation surrounding the outer wall;
   a layer of high temperature thermal insulation on an inner surface of the inner wall;
   heating elements positioned in an interior of the processing chamber;
   a gas inlet structure positioned through the inner and outer walls of the processing chamber and oriented to direct a flow of reactant gas against a substrate and a support in the processing chamber to form a CVD coating on the substrate;
   a gas outlet structure positioned through the inner and outer walls of the processing chamber and connected to a vacuum and effluent gas management system; and
   fluid inlet and outlet structures positioned to circulate heated thermal transfer fluid through a passage between the inner wall and the outer wall of the double wall vacuum processing chamber to maintain a controlled isothermal inner wall temperature above a condensation temperature to prevent effluent byproducts from condensing on the inner walls and the high temperature insulation in the chamber.

2. The CVD reactor of claim 1 wherein the metal is stainless steel.

3. The CVD reactor of claim 1 wherein the high temperature insulation is a fibrous insulation.

4. The CVD reactor of claim 3 wherein the fibrous insulation is carbon felt, graphite felt, rigidized carbon board, rigidized graphite board, oxide ceramic blanket, or rigid oxide board formed of silica, alumino-silicate, hi-alumina or zirconia.

5. The CVD reactor of claim 1 wherein the CVD coating comprises C, SiC, BN, $Si_3N_4B_4C$, HfC, $HfB_2$, TiN, $Al_2O_3$, W or WC.

6. The CVD reactor of claim 5 wherein the CVD coating comprises BN.

7. The CVD reactor of claim 6 wherein the reactant gas comprises a mixture of $BCl_3$ and $NH_3$.

8. The CVD reactor of claim 1 wherein the thermal transfer fluid comprises a mineral oil based thermal transfer fluid or synthetic aromatic thermal transfer fluid.

9. A method of coating a substrate by chemical vapor deposition (CVD) comprising:
   mounting the substrate in a CVD reactor that comprises;
   a double wall vacuum processing chamber with a metal inner wall and a metal outer wall and fluid passages between the inner wall and outer wall;
   a layer of thermal insulation covering the outer wall;
   a layer of high temperature thermal insulation on an inner surface of the inner wall;
   heating elements positioned in an interior of the processing chamber;
   a gas inlet structure positioned through the inner and outer wall of the processing chamber and oriented to direct a flow of reactant gas against the substrate;
   a gas outlet structure positioned through the inner and outer wall of the processing chamber and connected to a vacuum and effluent gas management system; and
   a fluid inlet and outlet structure positioned in the reactor to circulate fluid through the fluid passages;
   flowing temperature controlled thermal fluid in the fluid passages to maintain the inner wall of the reaction chamber at a controlled temperature above a condensation temperature of the reactant gas and reacted gas effluent;
   heating the substrate to at least one reaction temperature with the heating elements;
   directing a flow of the reactant gas at the heated substrate to form at least one ceramic coating on the substrate;
   eliminating excess reactant gas and reacted gas effluent from the chamber with the vacuum and effluent gas management system;
   returning the chamber to room temperature and pressure; and
   removing the coated substrate.

10. The method of claim 9 wherein the temperature of the inner wall of the double wall processing chamber is up to about 400° C.

11. The method of claim 10 wherein the temperature of the inner wall of the processing chamber is from about 150° C. to about 300° C.

12. The method of claim 9 wherein the ceramic coatings comprise C, SiC, BN, $Si_3N_4$, $B_4C$, HfC, $HfB_2$, TiN, $Al_2O_3$, W or WC.

13. The method of claim 12 wherein the ceramic coating comprises BN.

14. The method of claim 13 wherein the reactant gas is a mixture of $BCl_3$ and $NH_3$.

15. The method of claim 9 wherein the heating elements are resistance heating elements or inductive heating elements.

16. The method of claim 9 wherein the high temperature insulation is a fibrous insulation.

17. The method of claim 16 wherein the fibrous insulation comprises carbon felt, graphite felt, rigidized carbon board, rigidized graphite board, oxide ceramic blanket, or rigid oxide board formed of silica, alumino-silicate, hi-alumina or zirconia.

18. The method of claim 9 wherein the thermal transfer fluid comprises mineral oil based thermal transfer fluid or synthetic aromatic thermal transfer fluid.

* * * * *